United States Patent
Bai et al.

(10) Patent No.: US 11,963,406 B2
(45) Date of Patent: Apr. 16, 2024

(54) DISPLAY AND DISPLAY DEVICE

(71) Applicant: BOE TECHNOLOGY GROUP CO., LTD., Beijing (CN)

(72) Inventors: Xiao Bai, Beijing (CN); Shengji Yang, Beijing (CN); Kuanta Huang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 704 days.

(21) Appl. No.: 17/259,254

(22) PCT Filed: Mar. 27, 2020

(86) PCT No.: PCT/CN2020/081876
§ 371 (c)(1),
(2) Date: Jan. 11, 2021

(87) PCT Pub. No.: WO2021/189493
PCT Pub. Date: Sep. 30, 2021

(65) Prior Publication Data
US 2022/0140049 A1 May 5, 2022

(51) Int. Cl.
*H10K 59/131* (2023.01)
*H05K 1/18* (2006.01)
*H10K 50/87* (2023.01)

(52) U.S. Cl.
CPC .......... *H10K 59/131* (2023.02); *H05K 1/189* (2013.01); *H10K 50/87* (2023.02)

(58) Field of Classification Search
CPC ....... H05K 1/147; H05K 1/189; H10K 59/131
See application file for complete search history.

(56) References Cited

U.S. PATENT DOCUMENTS

| 7,897,483 B2 | 3/2011 | Yamazaki et al. |
| 9,953,625 B2 | 4/2018 | Kandori |

(Continued)

FOREIGN PATENT DOCUMENTS

| CN | 101471349 A | 7/2009 |
| CN | 102395246 A | 3/2012 |

(Continued)

OTHER PUBLICATIONS

Written Opinion of International Application No. PCT/CN2020/081876 dated Dec. 28, 2020.

(Continued)

*Primary Examiner* — Nathan Milakovich
(74) *Attorney, Agent, or Firm* — Perilla Knox & Hildebrandt LLP; Kenneth A. Knox

(57) ABSTRACT

A display includes a circuit board structure including a first circuit board and a second circuit board. The first circuit board has a carrying region and an electrical connection region on which a first pad is disposed. The second circuit board has a first region and a second region, the first region is arranged on the electrical connection region and is electrically connected to the first pad, and the second region is electrically connected to the driving terminal. The rigidity of the second circuit board is less than that of the first circuit board. The display substrate is in the carrying region and includes a silicon substrate in which a driving circuit is partially embedded, and a second pad electrically connected to the driving circuit. The driving circuit includes a transistor having a semiconductor layer which is inside the silicon substrate. The second pad is electrically connected to the first pad.

20 Claims, 4 Drawing Sheets

(56) References Cited

U.S. PATENT DOCUMENTS

| | | | |
|---|---|---|---|
| 2009/0166896 A1 | 7/2009 | Yamazaki et al. | |
| 2015/0016222 A1 | 1/2015 | Kandori | |
| 2018/0107074 A1* | 4/2018 | Xu | G02F 1/133602 |
| 2018/0212011 A1 | 7/2018 | Lai et al. | |
| 2020/0212153 A1 | 7/2020 | Lai et al. | |
| 2021/0408432 A1* | 12/2021 | Wei | G02F 1/1339 |
| 2022/0115484 A1* | 4/2022 | Lu | H10K 59/131 |
| 2022/0140052 A1* | 5/2022 | Bai | H05K 1/189 |
| | | | 257/40 |
| 2022/0322524 A1* | 10/2022 | Bai | H05K 1/0281 |
| 2023/0269974 A1* | 8/2023 | Li | H10K 59/131 |
| | | | 257/40 |

FOREIGN PATENT DOCUMENTS

| | | |
|---|---|---|
| CN | 104284283 A | 1/2015 |
| EP | 2823896 A2 | 1/2015 |
| EP | 2823896 A3 | 9/2015 |
| IN | 210093662 U | 2/2020 |
| TW | 201306674 A | 2/2013 |
| TW | 434626 B | 4/2014 |
| WO | 2012141117 A1 | 10/2012 |
| WO | 2017063568 A1 | 4/2017 |

OTHER PUBLICATIONS

Extended European Search Report for EP Patent Application No. 20900707.9 dated Apr. 21, 2023.

* cited by examiner

DISPLAY AND DISPLAY DEVICE

CROSS-REFERENCE TO RELATED APPLICATION

The present application is based on and claims priority to International Application No. PCT/CN2020/081876, filed on Mar. 27, 2020, where the contents of which are incorporated by reference in their entirety herein.

TECHNICAL FIELD

The present disclosure relates to the field of display technology, and in particular to a display and a display device.

BACKGROUND

In recent years, with the increasing progress of virtual reality (VR) technology and augmented reality (AR) technology, display devices suitable for the VR/AR field are also developing toward miniaturization, pixel per inch (PPI), fast response, and high color gamut. Silicon-based micro-display Organic Light-Emitting Diode (OLED) panel is one of the prominent directions. Although the silicon-based micro-display OLED started late, it is becoming a new focus of attention in the display field due to its advantages in miniaturization and high PPI.

Because the Flexible Printed Circuit (FPC) is mainly used in the AR/VR field, in order to facilitate the assembly of modules, the flexible printed circuit (FPC) has become the main way to connect silicon-based OLEDs to the driving terminal. However, since the FPC often uses the anisotropic conductive film (ACF) bonding process to connect with silicon-based OLED, the reliability is poor.

SUMMARY

In one embodiment of the present disclosure, a display is provided, the display including:

A circuit board structure, including a first circuit board and a second circuit board; the first circuit board has a carrying region and an electrical connection region, and a first pad being disposed on the electrical connection region; the second circuit board has a first region and a second region, the first region is arranged on the electrical connection region of the first circuit board and is electrically connected to the first pad, and the second region is configured to be electrically connected to a driving terminal; and a rigidity of the second circuit board is less than a rigidity of the first circuit board;

A display substrate, located on the carrying region of the first circuit board, the display substrate includes a silicon substrate, a driving circuit and a second pad; at least part of the driving circuit being embedded in the silicon substrate; the driving circuit includes a transistor having a semiconductor layer, and the semiconductor layer is located inside the silicon substrate; the second pad is electrically connected with the driving circuit, and the second pad is electrically connected with the first pad.

In one exemplary embodiment of the present disclosure, the first circuit board includes:

A plurality of dielectric boards, stacked in sequence; and

At least one trace layer, located in the electrical connection region; the at least one trace layer is located between adjacent ones of the plurality of dielectric boards and is electrically connected to the first pad;

The first region of the second circuit board is located between adjacent dielectric boards and is electrically connected to the trace layer.

In one exemplary embodiment of the present disclosure, the first circuit board further includes a plurality of heat dissipation holes, and the plurality of heat dissipation holes are located in the carrying region and penetrate through each dielectric board.

In one exemplary embodiment of the present disclosure, an aperture of the heat dissipation hole is 0.1 mm to 0.45 mm.

In one exemplary embodiment of the present disclosure:

A heat dissipation layer is provided on opposite sides of each dielectric board, and the heat dissipation layer is located in the carrying region;

And each heat dissipation hole penetrates through each dielectric board while also penetrating each heat dissipation layer.

In one exemplary embodiment of the present disclosure, the heat dissipation hole is a hole structure filled with metal material; the heat dissipation layer is a metal heat dissipation layer.

In one exemplary embodiment of the present disclosure, an orthographic projection of the display substrate on the dielectric board overlaps an orthographic projection of the heat dissipation layer on the dielectric board.

In one exemplary embodiment of the present disclosure, the plurality of dielectric boards stacked in sequence include a first dielectric board, a second dielectric board, and a third dielectric board that are sequentially stacked.

Where, the display substrate and the first pad are located on a side of the first dielectric board away from the second dielectric board.

The trace layer is located between the first dielectric board and the second dielectric board, and the trace layer is electrically connected to the first pad through a via hole.

The first region of the second circuit board is located between the second dielectric board and the third dielectric board, and the first region is electrically connected to the trace layer through a via hole.

In one exemplary embodiment of the present disclosure, the second circuit board is a flexible circuit board.

In one exemplary embodiment of the present disclosure, the second circuit board includes:

A flexible base;

A wiring layer, formed on the flexible base, the wiring layer includes a main wiring portion and a third pad electrically connected to the main wiring portion, the third pad is located in the first region and is electrically connected to the trace layer, and the main wiring portion is located in the second region; and A protection portion, located in the second region and formed on a side of the main wiring portion away from the flexible base.

In one exemplary embodiment of the present disclosure, a material of the flexible base and the protection portion is polyimide, and a material of the wiring layer is a metal material.

A material of the dielectric board is glass fiber, and a material of the trace layer is a metal material.

In one exemplary embodiment of the present disclosure, the second pad and the first pad are electrically connected through a metal lead.

In one exemplary embodiment of the present disclosure, the display further includes a protective film layer, the protective film layer covers the first pad, the second pad and the metal lead.

In one exemplary embodiment of the present disclosure, the display substrate has a display region and a bonding region located on at least one side of the display region, and the second pad is located in the bonding region.

The display substrate further includes a light-emitting element located in the display region, and the light-emitting element is formed on a side of the driving circuit away from a base substrate and electrically connected to the driving circuit.

In one exemplary embodiment of the present disclosure, the driving circuit further includes a scanning signal line, a data signal line, and a power voltage signal line.

Where, the power voltage signal line is electrically connected to the driving terminal through the second pad and the circuit board structure.

In one exemplary embodiment of the present disclosure, there is provided a display device, the display device includes the display of any one of the above described.

BRIEF DESCRIPTION OF THE DRAWINGS

The accompanying drawings are used to provide a further understanding of the embodiments of the present disclosure and to constitute a part of the specification, and are used to explain the present disclosure together with the embodiments of the present disclosure, and do not constitute a limitation of the embodiments of the present disclosure. The above and other features and advantages will become more apparent to those skilled in the art by describing detailed example embodiments with reference to the accompanying drawings. In the accompanying drawings.

DETAILED DESCRIPTION

Figure 1:
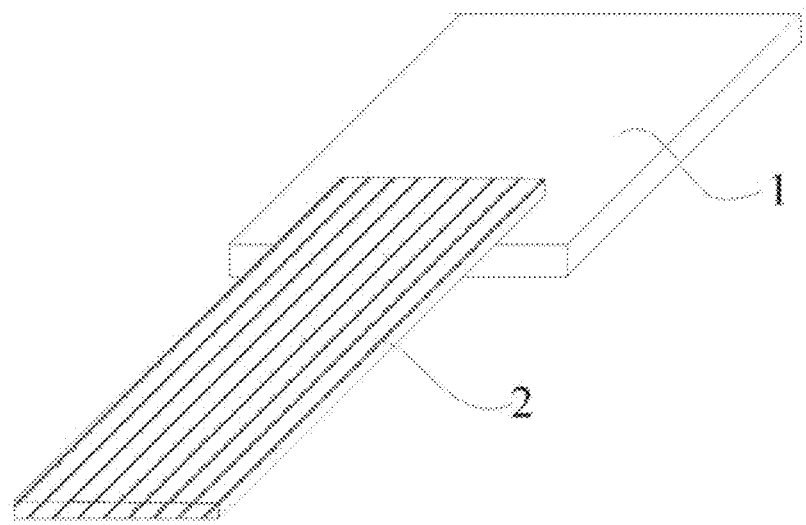
FIG. 1 is a schematic diagram of an assembly of a display substrate and a flexible circuit board in the related art.

In the following, the technical solutions of the present disclosure will be further described in detail through embodiments and in conjunction with the accompanying drawing. In the specification, the same or similar reference numeral(s) refer(s) to the same or similar component(s). The following description of the embodiments of the present disclosure with reference to the accompanying drawings is intended to explain the general inventive concept of the present disclosure, and should not be understood as a limitation of the present disclosure.

In addition, in the following detailed description, for the convenience of explanation, many specific details are set forth to provide a comprehensive understanding of the embodiments of the present disclosure. However, it is understood that one or more embodiments can also be implemented without these specific details.

It should be noted that "on . . . ", "formed on . . . ", and "disposed on . . . " in this application can mean that one layer is directly formed or disposed on another layer, and can also mean that one layer is indirectly formed or disposed on another layer, that is, there are other layers between these two layers.

The terms "one", "a/an", "this", "said", and "at least one" are used to denote the existence of one or more elements/components/etc. The terms "include/comprise" and "have" are used to denote the meaning of open inclusion and refer to the existence of additional elements/components/etc. in addition to the listed elements/components/etc.

It should be noted that although the terms "first", "second", "third", etc. may be used herein to describe various components, members, elements, regions, layers and/or portions, however, these components, members, elements, regions, layers and/or parts should not be limited by these terms. Instead, these terms are used to distinguish one component, member, element, region, layer, and/or part from another.

Figure 2:
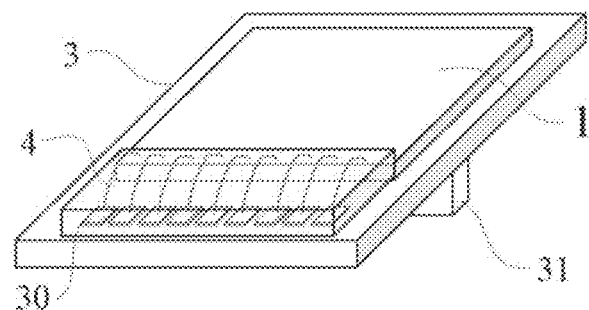
FIG. 2 is a schematic diagram of the assembly of the display substrate and the rigid circuit board in the related art.

In the related art, as shown in FIG. 1, the display substrate 1 is usually laminated with a flexible circuit board (FPC) 2 using an ACF process, and then is electrically connected to the driving terminal of the whole device through the FPC. Alternatively, as shown in FIG. 2, the display substrate 1 is directly disposed on the hard circuit board (PCB) 3, and is electrically connected to the pad 30 on the hard circuit board 3 through the leading wire 4 through the wire bonding process. Then, the PCB uses the back connector 31 to send the signal to the driving terminal of the whole device, but the display formed in this way has low reliability and poor assembly and integration performance.

Figure 3:
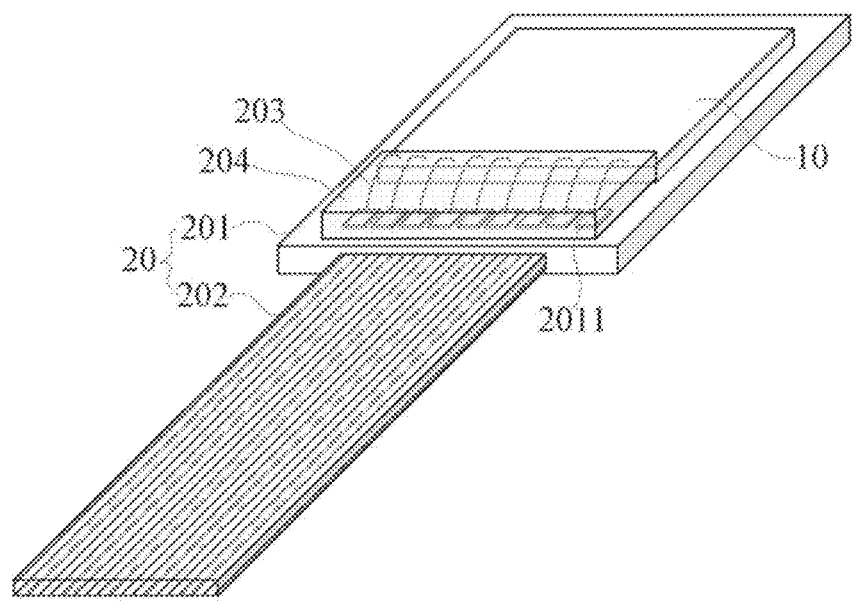
FIG. 3 is a schematic diagram of the structure of the display described in an embodiment of the disclosure.

As shown in FIG. 3, an embodiment of the present disclosure provides a display, which may include a display substrate 10 and a circuit board structure 20.

Where, as shown in FIGS. 3 to 5b, the circuit board structure 20 may include a first circuit board 201 and a second circuit board 202. The first circuit board 201 has a carrying region 201a and an electrical connection region 201b. The carrying region 201a is used to carry other components, such as: the display substrate 10, the electrical connection region 201b is used to realize the electrical connection between the first circuit board 201 and other components (for example, the display substrate 10 or the second circuit board 202). Specifically, a first pad 2011 is provided on the electrical connection region 201b. The second circuit board 202 has a first region 202a and a second region 202b. The first region 202a is arranged in the electrical connection region 201b and is electrically connected to the first pad 2011, and the second region 202b is configured to be electrically connected to a driving terminal (not shown in the figure). It should be noted that this driving terminal is the driving terminal of the entire display device.

Figure 5A:
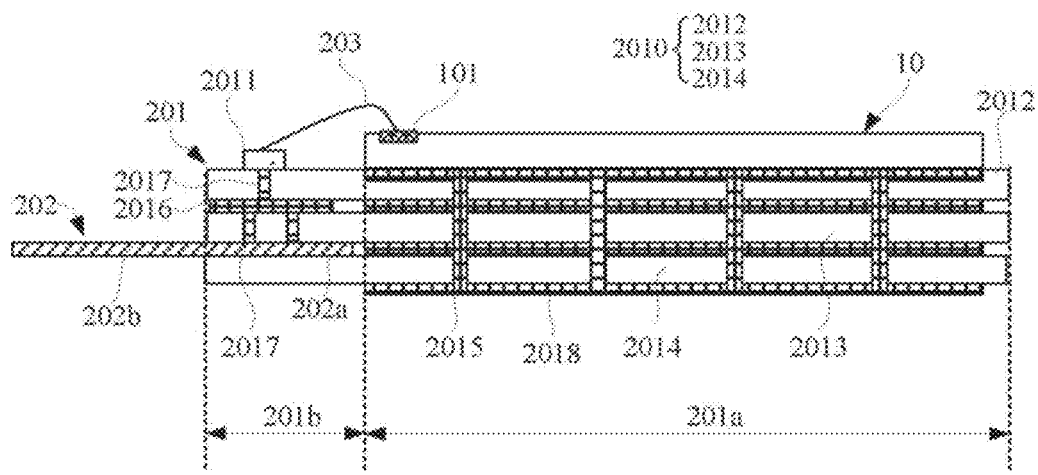
FIGS. 5a and 5b are schematic cross-sectional views of displays described in different embodiments of the disclosure.
Figure 5B:
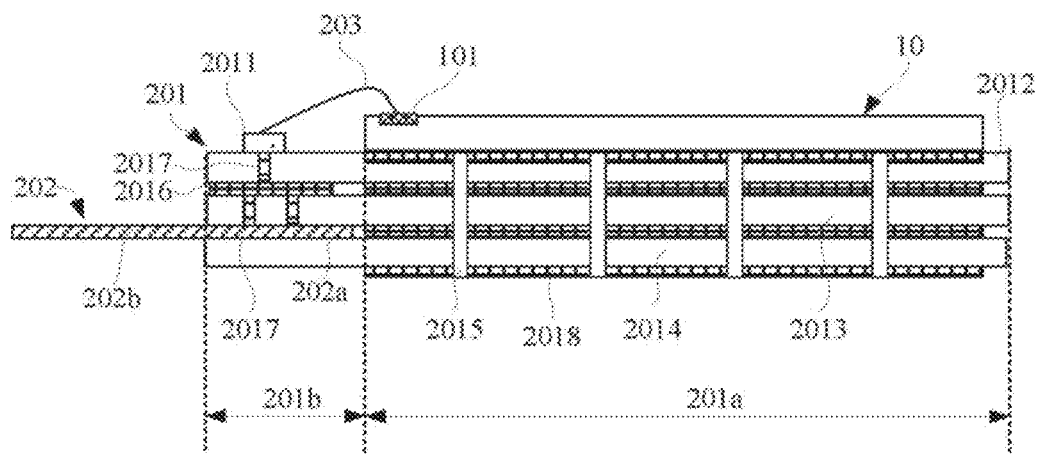
Figure 7:
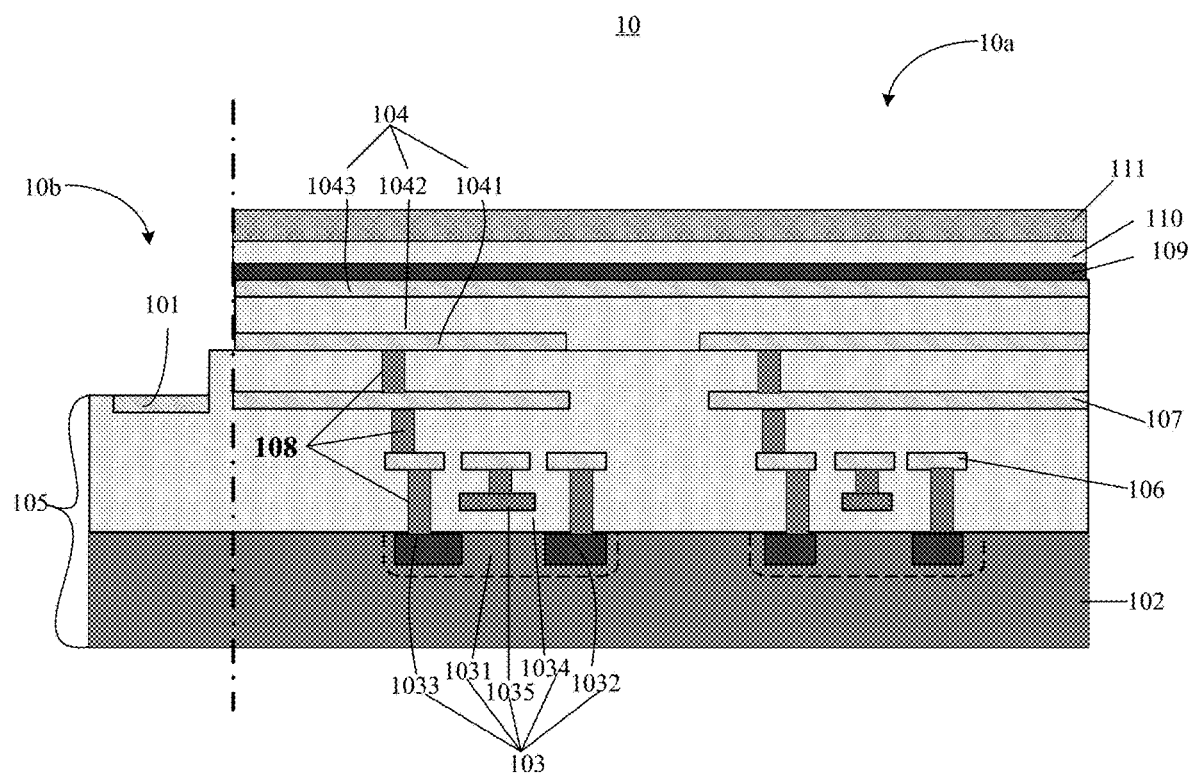
FIG. 7 is a schematic cross-sectional view of the display substrate described in an embodiment of the disclosure.

As shown in FIGS. 5a, 5b and 7, the display substrate 10 is located in the carrying region 201a of the first circuit board 201, and the display substrate 10 has a display region 10a and a bonding region 10b located on at least one side of the display region 10a, and the bonding region 10b is disposed with a second pad 101, the second pad 101 is electrically connected to the first pad 2011 to realize the electrical connection between the display substrate 10 and the circuit board structure 20.

In the embodiment of the present disclosure, since the carrying region 201a of the first circuit board 201 needs to carry other components, the rigidity of the first circuit board 201 can be designed to be greater, which can ensure that the first circuit board 201 can stably support the display substrate 10. The rigidity of the second circuit board 202 can be designed to be smaller, so that the second circuit board 202 has a certain bending ability. In this way, while ensuring that the circuit board structure 20 can be stably connected to the driving terminal of the whole device, the circuit board structure 20 can also be applied to a smaller or more complicated installation space, and the application range of the circuit board structure 20 is improved and is easy to assemble the whole device. That is, in the embodiment of the present disclosure, in order to ensure the above characteristics, the rigidity of the second circuit board 202 needs to be smaller than the rigidity of the first circuit board 201.

It should be noted that the rigidity mentioned in the embodiments of the present disclosure refers to the ability of a material or a structure to resist elastic deformation when subjected to a force. Among them, the more rigid an object, the less likely it is to deform. Since the rigidity of the second circuit board 202 is less than the rigidity of the first circuit board 201, the bending performance of the second circuit board 202 is better than the bending performance of the first circuit board 201.

In some embodiments, the second circuit board 202 may be a flexible circuit board, and the second circuit board 202 is easily bent. While the first circuit board 201 can be a rigid circuit board, and the first circuit board 201 is not easy to be bent.

Among them, because the rigid circuit board of the embodiment of the present disclosure is electrically connected to the driving terminal of the whole device through the flexible circuit board, compared with the solution of setting the back connector on the hard circuit board (PCB), while ensuring that the circuit board structure 20 can be stably connected to the driving terminal of the whole device, the thickness of the circuit board structure 20 can also be reduced, thereby reducing the thickness of the entire display.

In some embodiments, as shown in FIGS. 3 to 5b, the second pad 101 on the display substrate 10 and the first pad 2011 on the first circuit board 201 may be electrically connected by a metal lead 203 (for example, a gold wire); That is, the first circuit board 201 and the display substrate 10 can be electrically connected through the Wire Bonding process. Compared with the solution of bonding the FPC and the display substrate 10 by the ACF process, the connection stability between the circuit board structure 20 and the display substrate 10 can be improved, thereby the stable signal transmission can be ensured, and the reliability of the display can be ensured.

Among them, as shown in FIG. 3, the display further includes a protective film layer 204, the protective film layer 204 covers the first pad 2011, the second pad 101 and the metal lead 203, so as to prevent the first pad 2011, the second pad 101 and the metal lead 203 from being easily damaged. Thereby ensuring the stability of the connection among the first pad 2011, the second pad 101 and the metal lead 203.

For example, the protective film layer 204 can be a protecting adhesive, after the metal lead 203 is bound to the first pad 2011 and the second pad 101, a layer of protecting adhesive may be coated to protect the first pad 2011, the second pad 101 and the metal lead 203.

Figure 4:
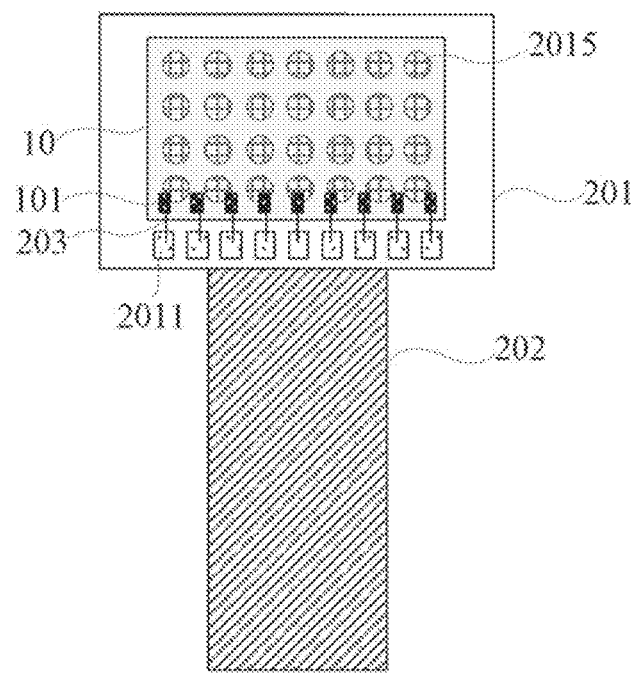
FIG. 4 is a schematic top view of the display described in an embodiment of the disclosure.

In some embodiments, as shown in FIGS. 4, 5a and 5b, the first circuit board 201 may include a dielectric board 2010 and a trace layer 2016.

In detail, the dielectric board 2010 may be disposed with multiple layers, and the multiple dielectric boards 2010 are stacked in sequence. As shown in FIGS. 5a and 5b, the dielectric board 2010 may include three layers stacked in sequence, namely a first dielectric board 2012, a second dielectric board 2013, and a third dielectric board 2014. Among them, the first dielectric board 2012 may be a top dielectric board, the side of the first dielectric board 2012 away from the second dielectric board 2013 is disposed with the display substrate 10 located in the carrying region 201a and a first pad 2011 located in the electrical connection region 201b. The second dielectric board 2013 is an intermediate dielectric board 2010. The third dielectric board 2014 may be a bottom dielectric board 2010.

It should be understood that the dielectric boards 2010 in the first circuit board 201 are not limited to the three layers shown in FIG. 5a and FIG. 5b, and can also be disposed with four layers, five layers, etc., depending on the specific situation.

The trace layer 2016 is located in the electrical connection region 201b of the first circuit board 201 and between adjacent dielectric boards 2010. The trace layer 2016 can be electrically connected to the first pad 2011. As shown in FIGS. 5a and 5b, a trace layer 2016 may be disposed between the first dielectric board 2012 and the second dielectric board 2013, the trace layer 2016 may be electrically connected to the first pad 2011 through a via hole 2017. Alternatively, the via hole 2017 is a hole structure filled with a metal material. It should be understood that the trace layer 2016 in the first circuit board 201 is not limited to one layer in FIGS. 5a and 5b, and may also be multiple layers. Since the electrical connection region 201b of the first circuit board 201 has a small area, in order to ensure that the wires of the first circuit board 201 can be disposed in the electrical connection region 201b, the trace layer 2016 is usually provided with multiple layers, and each trace layer 2016 is located between different adjacent dielectric boards 2010, and each of the trace layers 2016 is electrically connected through via hole 2017.

For example, in order to ensure that the first circuit board 201 has greater rigidity, the material of the dielectric board 2010 may be glass fiber, but it is not limited to this, and other materials may also be adopted, as long as the first circuit board 201 has sufficient support strength. The material of the trace layer 2016 can be a metal material, such as copper, aluminum, etc., to ensure good conductivity, but it is not limited to this, and can also be other materials with good conductivity.

In some embodiments, as shown in FIGS. 5a and 5b, the first circuit board 201 may be provided with a heat dissipation hole 2015, and there are a plurality of heat dissipation holes 2015. Also, each heat dissipation hole 2015 can penetrate through each dielectric board 2010, since each heat dissipation hole 2015 penetrates through each dielectric board 2010, when the display substrate 10 is formed on the part of the top dielectric board 2010 located in the carrying region 201a, the heat generated by the display substrate 10 can be transferred to the outside through the heat dissipation holes 2015, thereby it is possible to prevent the display substrate 10 from being overheated and causing deterioration of display performance.

In the embodiment of the present disclosure, since there is no need to provide a back connector on the back of the first circuit board 201, there is no need to provide signal wires in the carrying region 201a of the first circuit board 201, so a large number of heat dissipation holes 2015 can be provided in the entire carrying region 201a of the first circuit board 201 to greatly improve the heat dissipation capacity of the display substrate 10, thereby improving the display effect.

It should be understood that a plurality of heat dissipation holes 2015 may be evenly disposed in the carrying region 201a to ensure the uniformity of heat dissipation of the display substrate 10.

Alternatively, the aperture of the heat dissipation hole 2015 may be 0.1 mm to 0.45 mm, such as, 0.1 mm, 0.15 mm, 0.2 mm, 0.25 mm, 0.3 mm, 0.35 mm, 0.4 mm, 0.45 mm, etc. On the one hand, this design of the aperture of the heat dissipation hole 2015 described above can avoid the situation that the aperture of the heat dissipation hole 2015 is too large and the support strength of the first circuit board 201 is weakened; on the other hand, it can avoid the situation that the aperture of the heat dissipation hole 2015 is too small and the heat dissipation capacity is poor. That is, in the embodiment of the present disclosure, by designing the aperture of the heat dissipation hole 2015 to be 0.1 mm to 0.45 mm, while ensuring the support strength of the first circuit board 201, the heat dissipation capability can also be improved.

Further, as shown in FIG. 5a and FIG. 5b, heat dissipation layers 2018 located in the carrying region 201a are disposed on opposite sides of each dielectric board 2010 to further improve the heat dissipation capacity of the display and ensure a good display effect.

It should be noted that the aforementioned heat dissipation hole 2015 penetrates through each dielectric board 2010 and also penetrates each heat dissipation layer 2018, that is, the heat dissipation hole 2015 can connect each heat dissipation layer 2018. In the embodiment of the present disclosure, the heat generated by the display substrate 10 can be transferred to each heat dissipation layer 2018 through the heat dissipation hole 2015 for heat dissipation, so as to improve the heat dissipation efficiency.

As shown in FIG. 5a, the heat dissipation hole 2015 may be a hole structure filled with a metal material, and the heat dissipation layer 2018 may be a metal heat dissipation layer to improve the heat dissipation capability. It should be understood that the material filled in the heat dissipation hole 2015 and the material of the heat dissipation layer 2018 are not limited to metal materials such as copper and aluminum, and other materials with good heat dissipation capabilities are also possible. In addition, as shown in FIG. 5b, the heat dissipation hole 2015 may also be hollow, that is, no heat dissipation material such as metal is filled in the heat dissipation hole 2015.

Alternatively, the orthographic projection of the display substrate 10 on the dielectric board 2010 overlaps with the orthographic projection of the heat dissipation layer 2018 on the dielectric board 2010, or the orthographic projection of the display substrate 10 on the dielectric board 2010 is located within the orthographic projection of the heat dissipation layer 2018 on the dielectric board 2010, in this way, the contact area between the heat dissipation layer 2018 and the display substrate 10 can be increased, thereby further improving the heat dissipation efficiency.

Figure 6:
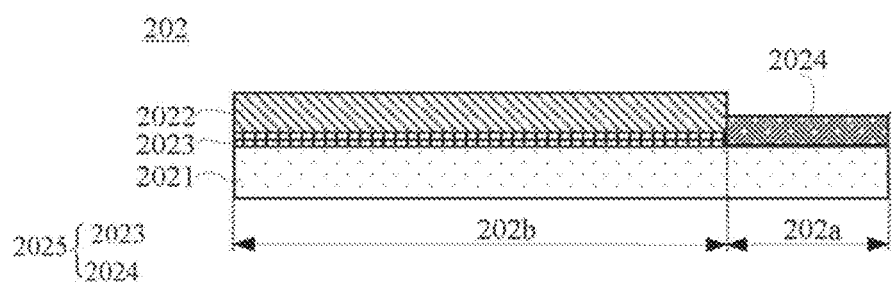
FIG. 6 is a schematic cross-sectional view of a second circuit board described in an embodiment of the disclosure.

In some embodiments, as shown in FIG. 5a, FIG. 5b and FIG. 6, the first region 202a of the second circuit board 202 is located between adjacent dielectric boards 2010 of the first circuit board 201 and is electrically connected to the trace layer 2016, that is, the second circuit board 202 is partially sandwiched between adjacent dielectric boards 2010 of the first circuit board 201, this design can not only ensure the stability of the connection between the second circuit board 202 and the first circuit board 201, but also facilitate the electrical connection between the second circuit board 202 and the first circuit board 201 inside the first circuit board 201, while ensuring the stability of the electrical connection, it can also reduce the difficulty of the electrical connection.

As shown in FIG. 5a, FIG. 5b and FIG. 6, the first region 202a of the second circuit board 202 is disposed between the second dielectric board 2013 and the third dielectric board 2014, and the first region 202a can be electrically connected to the trace layer 2016 through the via hole 2017; however, it is not limited to this. The first region 202a of the second circuit board 202 can also be disposed on the same layer with the trace layer 2016, as long as the first region 202a of the second circuit board 202 and the trace layer 2016 can be stably connected.

The first region 202a of the second circuit board 202 and the trace layer 2016 can be electrically connected through a plurality of via holes 2017 to ensure stable electrical connection between the first circuit board 201 and the second circuit board 202.

In some embodiments, as shown in FIG. 6, the second circuit board 202 may include a flexible base 2021, a wiring layer 2025, and a protection portion 2022. The wiring layer 2025 is formed on the flexible base 2021, and the wiring layer 2025 may include a main wiring portion 2023 and a third pad 2024 electrically connected to the main wiring portion 2023, the third pad 2024 is located in the first region 202a and is electrically connected to the trace layer 2016 of the first circuit board 201, and the main wiring portion 2023 is located in the second region 202b. The protection portion 2022 is located in the second region 202b and is formed on the side of the main wiring portion 2023 away from the flexible base 2021. The protection portion 2022 can protect the main wiring portion 2023 on the second circuit board 202. In addition, the structural stability of the second circuit board 202 can be ensured, which facilitates the overall assembly of the product. It should be understood that the second circuit board 202 is not limited to the single-layer wiring shown in FIG. 6, and may also be a double-layer wiring. That is, wiring layers 2025 may be disposed on both sides of the flexible base 2021, and the protection portion 2022 covering the main wiring portion 2023 is disposed on the side of each wiring layer 2025 away from the flexible base 2021.

For example, the material of the flexible base 2021 and the protection portion 2022 may be polyimide or other materials to improve the flexibility of the second circuit board 202, so that the second circuit board 202 is easy to bend. However, it is not limited to this, and it can also be made of other materials, as long as the second circuit board 202 can have good bendability. The material of the wiring layer 2025 may be a metal material (for example, copper, aluminum, etc.) to ensure that the second circuit board 202 has good conductivity, but it is not limited to this, and other materials with good conductivity may also be used.

In some embodiments, as shown in FIG. 7, the display substrate 10 may include a base substrate and a driving circuit 100.

Where, the base substrate may be a silicon substrate 102, and the silicon substrate 102 is, for example, single crystal silicon or high-purity silicon.

At least part of the driving circuit 100 is embedded in the silicon substrate 102 so that it is integrally formed as the driving substrate 105. It should be understood that the driving circuit 100 may include a circuit structure located in the display region 10a, and may also include a circuit structure located in the bonding region 10b. The driving circuit 100 may include a transistor which is provided with a semiconductor layer located inside the silicon substrate 102, where, there are a plurality of transistors in the driving circuit 100, and the transistors can be distributed not only in the display region 10a, but also in the bonding region 10b, or in other non-display regions.

The driving circuit 100 of the embodiment of the present disclosure may be electrically connected to the second pad 101 of the bonding region 10b. As shown in FIG. 4, the second pad 101 is bound to the first pad 2011 of the first circuit board 201 to provide a signal to the display substrate 10, for example, a power voltage signal; that is, the driving circuit 100 may include a power voltage signal line (not shown in the figure), and this power voltage signal line may be electrically connected to the second pad 101, that is, the power voltage signal line can be electrically connected to the driving terminal through the second pad 101 and the circuit board structure 20 to obtain the power voltage signal from the driving terminal.

In some embodiments, the second pad 101 may be disposed in the same layer with the conductive structure in the display region 10a to save process. For example, the second pad 101 may be disposed in the same layer with the conductive layer 107 located at the top layer (farthest from the silicon substrate 102) below the light-emitting element 104 in the display region 10a to facilitate the subsequent bonding processes.

It should be noted that the "disposed in the same layer" in the embodiments of the present disclosure means that multiple structures are formed from the same material film through the same or different patterning processes, and thus have the same material.

Specifically, the driving circuit 100 may include a pixel circuit located in the display region 10a, and the pixel circuit may be formed on the silicon substrate 102 through a semiconductor process, for example, forming the semiconductor layer 1031 (that is, the active layer), the source electrode 1032 and the drain electrode 1033 of the driving transistor 103 on the silicon substrate 102 through a doping process, forming the insulating layer 1034 through a silicon oxidation process, and forming the gate electrode 1035 and the plurality of conductive layers 106, 107 through a sputtering process or other processes. The semiconductor layer 1031 of the transistor 103 is located inside the silicon substrate 102, that is, the semiconductor layer 1031 may belong to a part of the silicon substrate 102.

It should be noted that the driving circuit 100 may also include a gate driving circuit, a data driving circuit, a data signal line, and a scanning signal line. The data driving circuit and the gate driving circuit are respectively connected with the pixel circuit through the data signal line and the scanning signal line to provide electrical signals. The data driving circuit is used to provide data signals, and the gate driving circuit is used to provide scanning signals, and can be further used to provide various control signals, power signals, and the like.

In some embodiments, the gate driving circuit and the data driving circuit may also be integrated in the silicon substrate 102 through the aforementioned semiconductor process. That is to say, the silicon substrate 102 is used as the base substrate in the display substrate 10, and the pixel circuit, the gate driving circuit, and the data driving circuit may all be integrated on the silicon substrate 102. In this case, since the silicon-based circuit can achieve higher accuracy, the gate driving circuit and the data driving circuit can also be formed, for example, in an area corresponding to the display region 10a of the display substrate 10, and not necessarily in the non-display region. Among them, the gate driving circuit and the data driving circuit can adopt conventional circuit structures in the art, which are not limited in the embodiments of the present disclosure.

In some embodiments, as shown in FIG. 7, the display substrate 10 may further include a light-emitting element 104 formed on the side of the driving circuit 100 away from the silicon substrate 102 and located in the display region 10a. The light-emitting element 104 may be electrically connected to the driving circuit 100. In detail, the light-emitting element 104 may include an anode 1041, a light-emitting layer 1042, and a cathode 1043 sequentially formed on the driving substrate 105. The anode 1041 can be electrically connected to the drain electrode 1033 of the transistor 103 through the contact holes 108 filled with conductive material (such as metal tungsten, etc.) and the plurality of conductive layers 106 and 107. As shown in FIG. 7, one insulating layer 1034 and two conductive layers 106 and 107 are shown. However, the number of insulating layers and conductive layers is not limited in the embodiment of the present disclosure.

Where, there may be a plurality of light-emitting elements 104, the anodes 1041 of the multiple light-emitting elements 104 are disconnected from each other, and the cathodes 1043 of the multiple light-emitting elements 104 may be disposed as a whole layer. It should be noted that a spacer (PDL) may or may not be disposed between adjacent anodes 1041, which depending on the specific situation.

In some embodiments, the top conductive layer 107 in the driving substrate 105 is reflective, for example, the top conductive layer 107 is a laminated structure of titanium/titanium nitride/aluminum. For example, the conductive layer 107 includes a plurality of sub-layers disposed at intervals, which are respectively disposed in a one-to-one correspondence with the anode 1041 of each light-emitting element 104. In the top emission structure, the conductive layer 107 can be configured as a reflective layer for reflecting the light emitted by the light-emitting element 104 and improving the light extraction efficiency. For example, the orthographic projection of the anode 1041 of each light-emitting element 104 on the silicon substrate 102 falls within the orthographic projection of the corresponding conductive layer thereof on the silicon substrate 102. In this case, the anode 1041 may use a transparent conductive oxide material with a high work function, such as Indium Tin Oxide (ITO), Indium Zinc Oxide (IZO), etc.

In some embodiments, the display substrate 10 further includes an encapsulating layer 109, a color film layer 110, a cover plate 111, etc. on the side of the light-emitting element 104 away from the silicon substrate 102. For example, the first encapsulating layer 109 is configured to seal the light-emitting element 104 to prevent external moisture and oxygen from penetrating into the light-emitting element 104 and the pixel circuit and causing damage to the means. For example, the first encapsulating layer 109 includes an inorganic thin film or a structure in which organic thin films and inorganic thin films are alternately stacked. The color film layer 110 may include color blocks such as R (red), G (green), and B (blue). The cover plate 111 is, for example, a glass cover plate. Where, an encapsulating layer 109 may also be disposed between the color film layer 110 and the cover plate 111 to encapsulate the color film layer 110.

In some embodiments, the display substrate 10 is an organic light-emitting diode (OLED) display substrate or a mini-type OLED (Micro OLED) display substrate.

An embodiment of the present disclosure also provides a display device, which includes the display described in any of the above embodiments.

According to the embodiments of the present disclosure, the specific type of the display device is not particularly limited, the types of display devices commonly used in this field can be used, for example, display screens, mobile devices such as mobile phones, notebook computers, wearable devices such as watches, VR devices, etc. Those skilled in the art can make a corresponding selection according to the specific purpose of the display device, which will not be repeated here.

It should be noted that in addition to the array substrate, the display device also includes other necessary components and constitutes. Taking the display as an example, it may also include a housing, a main circuit board, a power line, etc., and those skilled in the art can make corresponding supplements according to the specific use requirements of the display device, which will not be repeated here. Those skilled in the art will easily think of other embodiments of the present disclosure after considering the specification and practicing the content disclosed herein. The application intends to cover any variants, usage, or changes of adaptation of the present disclosure. These variants, usage, or changes of adaptation follow the general principles of the present disclosure, and include common sense or common technical means in the technical field not disclosed by the disclosure. The specification and embodiments are only exemplary, and the true scope and spirit of the present disclosure are defined by the appended claims.

What is claimed is:

1. A display, comprising:
   a circuit board structure comprising a first circuit board and a second circuit board; the first circuit board having a carrying region and an electrical connection region, and a first pad being disposed on the electrical connection region; the second circuit board having a first region and a second region, the first region being arranged on the electrical connection region of the first circuit board and being electrically connected to the first pad, and the second region being configured to be electrically connected to a driving terminal; and a rigidity of the second circuit board being less than a rigidity of the first circuit board; and
   a display substrate located on the carrying region of the first circuit board, the display substrate comprising a silicon substrate, a driving circuit and a second pad; at least part of the driving circuit being embedded in the silicon substrate; the driving circuit comprising a transistor having a semiconductor layer, and the semiconductor layer being located inside the silicon substrate; the second pad being electrically connected with the driving circuit, and the second pad being electrically connected with the first pad.

2. The display according to claim 1, wherein the first circuit board comprises:
   a plurality of dielectric boards, stacked in sequence; and
   at least one trace layer, located in the electrical connection region; the at least one trace layer is between adjacent ones of the plurality of dielectric boards and is electrically connected to the first pad;
   the first region of the second circuit board is located between adjacent dielectric boards and is electrically connected to the at least one trace layer.

3. The display according to claim 2, wherein the first circuit board further comprises a plurality of heat dissipation holes, and the plurality of heat dissipation holes are in the carrying region and configured to penetrate through each dielectric board.

4. The display according to claim 3, wherein an aperture of each of the heat dissipation holes is 0.1 mm to 0.45 mm.

5. The display according to claim 3, wherein:
   a heat dissipation layer is provided on opposite sides of each dielectric board, and the heat dissipation layers are in the carrying region;
   and each heat dissipation hole of the heat dissipation holes is configured to penetrate through each dielectric board while also penetrating each heat dissipation layer.

6. The display according to claim 5, wherein each of the heat dissipation holes is a hole structure filled with metal material, and each of the heat dissipation layers is a metal heat dissipation layer.

7. The display according to claim 5, wherein an orthographic projection of the display substrate on one of the dielectric boards is configured to overlap orthographic projections of the heat dissipation layers on the one of the dielectric boards.

8. The display according to claim 3, wherein:
   the plurality of dielectric boards stacked in sequence comprise a first dielectric board, a second dielectric board, and a third dielectric board that are sequentially stacked;
   the display substrate and the first pad are on a side of the first dielectric board away from the second dielectric board;
   the at least one trace layer is between the first dielectric board and the second dielectric board, and the at least one trace layer is electrically connected to the first pad through a via hole;
   the first region of the second circuit board is between the second dielectric board and the third dielectric board; and
   the first region is electrically connected to the at least one trace layer through a via hole.

9. The display according to claim 2, wherein:
   the plurality of dielectric boards stacked in sequence comprise a first dielectric board, a second dielectric board, and a third dielectric board that are sequentially stacked;
   the display substrate and the first pad are on a side of the first dielectric board away from the second dielectric board;
   the at least one trace layer is between the first dielectric board and the second dielectric board, and the at least one trace layer is electrically connected to the first pad through a via hole;
   the first region of the second circuit board is between the second dielectric board and the third dielectric board; and
   the first region is electrically connected to the at least one trace layer through a via hole.

10. The display according to claim 2, wherein the second circuit board is a flexible circuit board.

11. The display according to claim 10, wherein the second circuit board comprises:
    a flexible base;
    a wiring layer, formed on the flexible base, the wiring layer comprises a main wiring portion and a third pad electrically connected to the main wiring portion, the third pad is in the first region and is electrically connected to the at least one trace layer, and the main wiring portion is in the second region; and
    a protection portion, located in the second region and formed on a side of the main wiring portion away from the flexible base.

12. The display according to claim 11, wherein:
a material of the flexible base and the protection portion is polyimide, and a material of the wiring layer is a metal material; and
a material of any one of the dielectric boards is glass fiber, and a material of the at least one trace layer is a metal material.

13. The display according to claim 1, wherein the second pad and the first pad are electrically connected through a metal lead.

14. The display according to claim 13, wherein the display further comprises a protective film layer, the protective film layer covers the first pad, the second pad and the metal lead.

15. The display according to claim 1, wherein:
the display substrate is configured to have a display region and a bonding region located at at least one side of the display region, and the second pad is in the bonding region;
the display substrate further comprises a light-emitting element located in the display region, and the light-emitting element is on a side of the driving circuit away from a base substrate and electrically connected to the driving circuit.

16. The display according to claim 1, wherein the driving circuit further comprises a scanning signal line, a data signal line, and a power voltage signal line; and
wherein the power voltage signal line is electrically connected to the driving terminal through the second pad and the circuit board structure.

17. An electronic device, comprising:
a display, the display comprising:
a circuit board structure comprising a first circuit board and a second circuit board; the first circuit board having a carrying region and an electrical connection region, and a first pad being disposed on the electrical connection region; the second circuit board having a first region and a second region, the first region being arranged on the electrical connection region of the first circuit board and being electrically connected to the first pad, and the second region being configured to be electrically connected to a driving terminal; and a rigidity of the second circuit board being less than a rigidity of the first circuit board; and
a display substrate located on the carrying region of the first circuit board, the display substrate comprising a silicon substrate, a driving circuit and a second pad; at least part of the driving circuit being embedded in the silicon substrate; the driving circuit comprising a transistor having a semiconductor layer, and the semiconductor layer being located inside the silicon substrate; the second pad being electrically connected with the driving circuit, and the second pad being electrically connected with the first pad.

18. The electronic device according to claim 17, wherein:
the first circuit board comprises:
a plurality of dielectric boards are stacked in sequence;
at least one trace layer located in the electrical connection region, wherein the at at least one trace layer is between adjacent one of the plurality of dielectric boards and is electrically connected to the first pad; and
the first region of the second circuit board is located between adjacent dielectric boards and is electrically connected to the at least one trace layer.

19. The electronic device according to claim 18, wherein the first circuit board further comprises a plurality of heat dissipation holes, and the plurality of heat dissipation holes are in the carrying region and configured to penetrate through each dielectric board.

20. The electronic device according to claim 18, wherein the plurality of dielectric boards stacked in sequence comprise a first dielectric board, a second dielectric board, and a third dielectric board that are sequentially stacked; wherein:
the display substrate and the first pad are on a side of the first dielectric board away from the second dielectric board;
the at least one trace layer is between the first dielectric board and the second dielectric board, and the at least one trace layer is electrically connected to the first pad through a via hole; and
the first region of the second circuit board is between the second dielectric board and the third dielectric board, and the first region is electrically connected to the at least one trace layer through a via hole.

* * * * *